US012619163B1

(12) United States Patent
Huff

(10) Patent No.: US 12,619,163 B1
(45) Date of Patent: May 5, 2026

(54) MANUFACTURING OF TEST STRUCTURES USING E-BEAM LITHOGRAPHY FOR USE IN CHARACTERIZATION AND QUALITY CONTROL OF METROLOGY TOOLS USED IN SEMICONDUCTOR MANUFACTURING

(71) Applicant: CORPORATION FOR NATIONAL RESEARCH INITIATIVES, Reston, VA (US)

(72) Inventor: Michael A. Huff, Oakton, VA (US)

(73) Assignee: Corporation for National Research Initiatives, Reston, VA (US)

( * ) Notice: Subject to any disclaimer, the term of this patent is extended or adjusted under 35 U.S.C. 154(b) by 717 days.

(21) Appl. No.: 17/552,700

(22) Filed: Dec. 16, 2021

(51) Int. Cl.
G03F 7/00 (2006.01)
G01N 23/2251 (2018.01)
G03F 7/16 (2006.01)
G03F 7/20 (2006.01)

(52) U.S. Cl.
CPC ....... *G03F 7/7065* (2013.01); *G01N 23/2251* (2013.01); *G03F 7/167* (2013.01); *G03F 7/2059* (2013.01); *G03F 7/70516* (2013.01); *G01N 2223/07* (2013.01); *G01N 2223/418* (2013.01); *G01N 2223/507* (2013.01); *G01N 2223/6116* (2013.01)

(58) Field of Classification Search
None
See application file for complete search history.

(56) References Cited

U.S. PATENT DOCUMENTS

| | | | | |
|---|---|---|---|---|
| 5,411,937 A | * | 5/1995 | Wendt ............... | H10N 60/0941 505/413 |
| 5,962,863 A | * | 10/1999 | Russell ............... | H10D 62/145 257/14 |
| 2003/0175623 A1 | * | 9/2003 | Kobayashi ............... | G03F 1/78 430/296 |
| 2003/0215664 A1 | * | 11/2003 | Morales ............... | B29C 33/424 430/323 |
| 2004/0077107 A1 | * | 4/2004 | Vogeli ................... | B82Y 10/00 977/843 |
| 2006/0063264 A1 | * | 3/2006 | Turner .................... | G02B 6/13 506/39 |
| 2015/0130473 A1 | * | 5/2015 | Agah .................... | G01N 27/68 324/464 |

FOREIGN PATENT DOCUMENTS

KR 10-2007-0051008 A * 5/2007

OTHER PUBLICATIONS

Machine translation of KR 0-2007-0051008A, published on Jun. 17, 2007 (Year: 2007).*

* cited by examiner

*Primary Examiner* — Anca Eoff
(74) *Attorney, Agent, or Firm* — Nixon & Vanderhye, P.C.

(57) ABSTRACT

A method is provided for making test structures suitable for characterizing and calibrating semiconductor metrology equipment. The test structure may include patterned chromium features that protrude vertically from a thin-film gold surface deposited onto a fused silica substrate.

9 Claims, 10 Drawing Sheets

500

501

502

10 µm

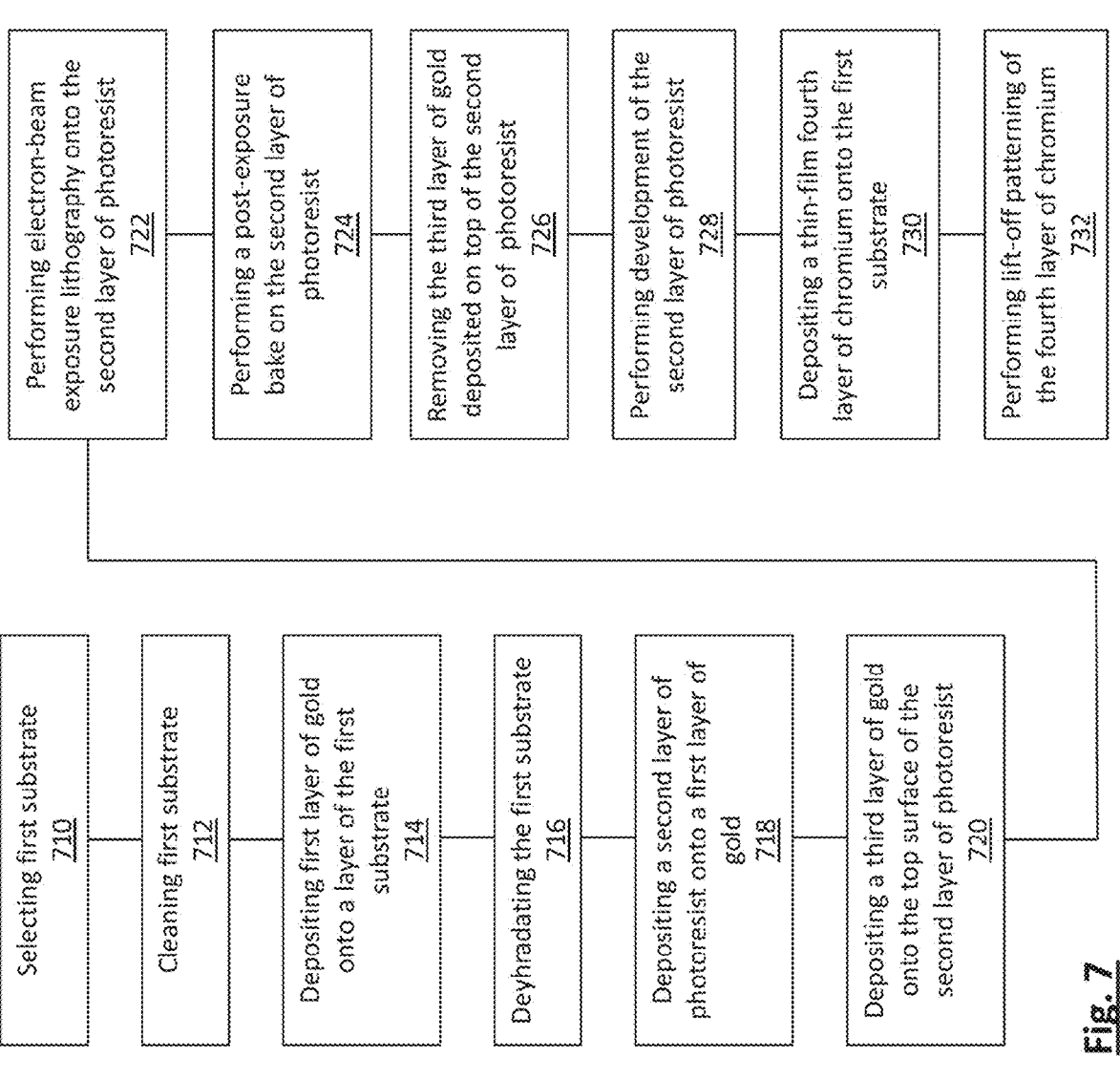

Performing electron-beam exposure lithography onto the second layer of photoresist
722

Performing a post-exposure bake on the second layer of photoresist
724

Removing the third layer of gold deposited on top of the second layer of photoresist
726

Performing development of the second layer of photoresist
728

Depositing a thin-film fourth layer of chromium onto the first substrate
730

Performing lift-off patterning of the fourth layer of chromium
732

Selecting first substrate
710

Cleaning first substrate
712

Depositing first layer of gold onto a layer of the first substrate
714

Deyhradating the first substrate
716

Depositing a second layer of photoresist onto a first layer of gold
718

Depositing a third layer of gold onto the top surface of the second layer of photoresist
720

MANUFACTURING OF TEST STRUCTURES USING E-BEAM LITHOGRAPHY FOR USE IN CHARACTERIZATION AND QUALITY CONTROL OF METROLOGY TOOLS USED IN SEMICONDUCTOR MANUFACTURING

FIELD OF INVENTION

The present invention is directed to the fabrication and manufacturing of test structures and more particularly to the fabrication and manufacturing of test structures made using e-beam lithography that are employed for quality control and characterization of metrology equipment used in semiconductor manufacturing.

BACKGROUND

A processing step is the most fundamental element for the fabrication of microsystems and is usually, but not always, performed on a single item of equipment. There are a number of types of processing steps with the most general types including: thin-film depositions; etching; photolithography; planarization; introduction of dopants; and so on.

A process sequence can be used at various levels of maturity of the microsystems manufacturing, ranging from the initial process sequence development to something that has been sufficiently developed to the point where working devices can be reliably manufactured.

SUMMARY OF INVENTION

The present invention relates to metrology techniques used to measure and characterize features made on semiconductor surfaces. Specifically, the manufacturing of test structures that can be used to characterize and maintain quality control of the metrology tools used in semiconductor manufacturing.

BRIEF DESCRIPTION OF THE DRAWINGS

FIG. 7 illustrates a method for making test structures suitable for characterizing and calibrating semiconductor metrology equipment according to an example of the present technology.

DETAILED DESCRIPTION OF THE INVENTION

Figure 1:
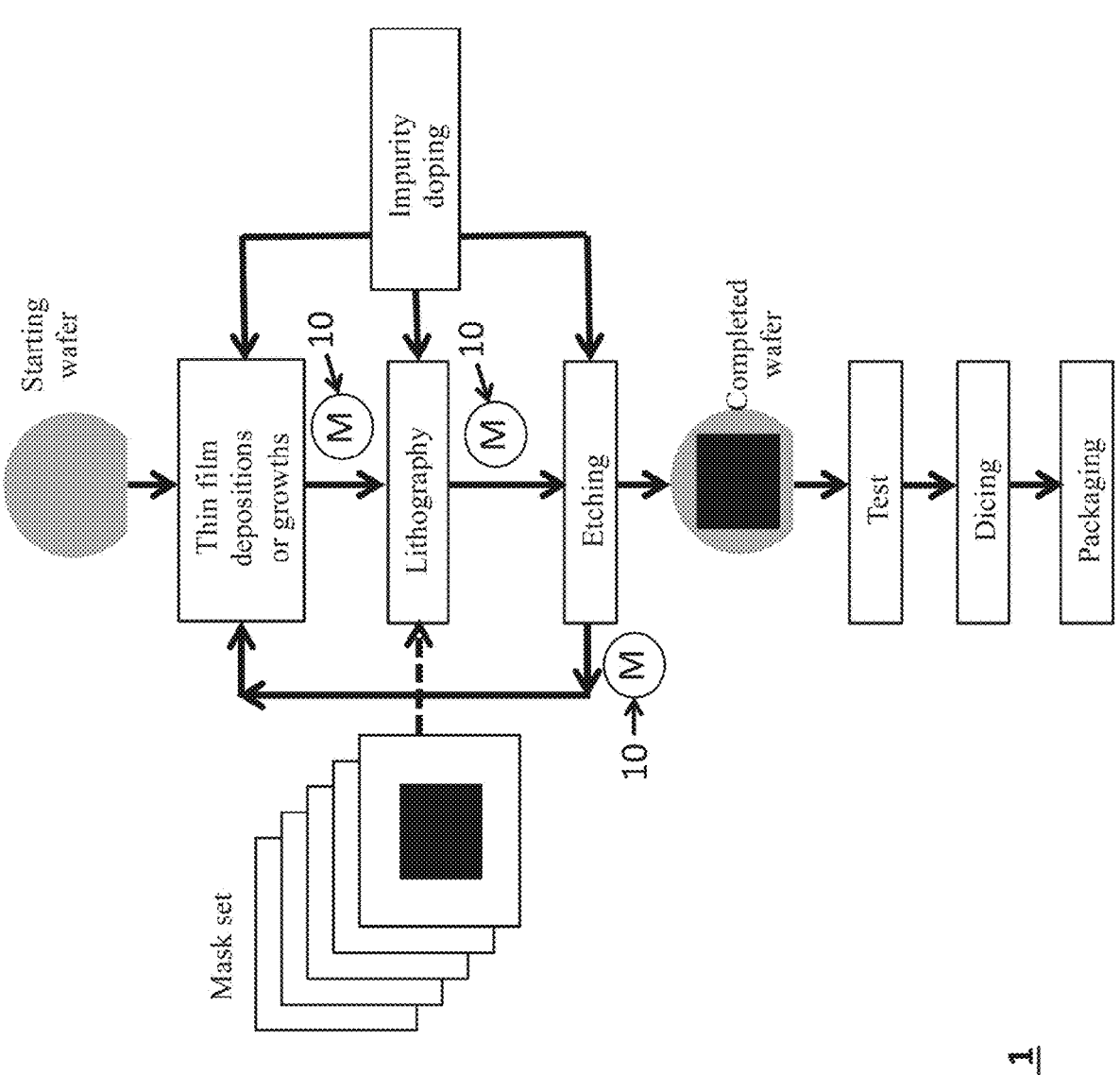
FIG. 1 is an illustration of the fabrication of microsystems devices using semiconductor manufacturing methods.

Herein, and throughout this disclosure, micro- and nanosystems is defined as devices made using semiconductor manufacturing methods for the implementation of integrated circuits whether digital, analog or both (i.e., mixed signal circuits); micro-electro-mechanical systems (MEMS); photonics; nano-electro-mechanical systems (NEMS); vacuum electronics; compound semiconductor devices and systems; nanotechnology; and any technology using or partly using semiconductor fabrication methods. To avoid needless repetition, throughout this disclosure the term microsystems will be used as the label for both microsystems and nanosystems since these technologies use the same fabrication methods.

Semiconductor manufacturing for the production of micro- and nanosystems is an advanced and rapidly changing industry. Most micro- and nanosystems are made what is called a process sequence. A process sequence is defined as a grouping of processing steps that have been assembled into an ordered, sequentially-performed sequence of procedures that are performed on a substrate or set of substrates, which are sufficient to result in functional devices.

A processing step is defined as a single process operation that is performed on a substrate or a set of substrates in order to advance the fabrication of devices, but is not sufficient to result in the complete implementation of functional devices.

As discussed above, a processing step is the most fundamental element for the fabrication of microsystems and is usually, but not always, performed on a single item of equipment. There are a number of types of processing steps with the most general types including: thin-film depositions; etching; photolithography; planarization; introduction of dopants; and so on.

A process sequence can be used at various levels of maturity of the microsystems manufacturing, ranging from the initial process sequence development to something that has been sufficiently developed to the point where working devices can be reliably manufactured.

Some of the major categories of processing step types used in process sequences includes (see FIG. 1): thin film depositions or growths; lithography; etching; impurity doping; and metrology. Additionally, depending on the IC process sequence involved, there may be other types of processes in the sequence as well such as planarization, rapid thermal anneals, cleans, and others. That is, there are other processing steps that can also be used not shown in FIG. 1, particularly more specified device production, but the actual processing steps included in a process sequence is not important to the present disclosure. The important point of FIG. 1 is that metrology is an essential element of most process sequences and are performed at various stages of the process sequence to monitor how well the processing sequence is progressing to result in working devices.

The metrology steps 10 (labeled by circled M in FIG. 1) are typically performed after various important process steps and mostly involve inspections and/or measurements of various processing related items, such as: measurements of the thicknesses and uniformity of thin films deposited; measurements of the dimensions of the features made in photoresist after a lithography has been performed; measurement of the dimensions of features made in a material layer after etching; and inspection of features made in the material layers; and inspection of any defects that may exist on the substrates.

Some processing steps are repeated multiple times in the process sequence as shown in FIG. 1. For example, the photolithography processing step (i.e., an optical form of lithography) may be performed many times in a modern state-of-the-art multi-layered-metal CMOS IC manufacturing process. Additionally, there will likely be multiple thin-film depositions, etches, and impurity implantations during a process sequence, although the specifics of the processing steps, such as material types and thicknesses will often vary at various points in the process sequence.

A cycle as shown in FIG. 1 wherein a deposition of a thin film layer, followed by a photolithography, then followed by an etch may be repeated a number of times on different material layers and material systems, and usually (but not always) the number of times this cycle is repeated in equal to the number of mask plates in the mask set. A mask set is shown at the far left and typically there may be more than 30 individual mask plates used in an advanced IC manufacturing process. Often the number of photolithography steps that are performed is often used as a measure of the complexity of a process sequence. The minimum feature size is usually the other measure of the complexity of a process sequence.

Once the fabrication of the devices is completed, the completed wafers will usually go through a series of wafer-level tests to determine the good die from the bad (e.g., functional testing), followed by parametric testing to differentiate the die according to some pre-defined categories of performance specifications, or both. The wafer is then diced into individual die and then packaged. A final test may be performed after packaging to ensure that the packaged device works as designed.

A key element of semiconductor manufacturing is the metrology. Microsystems fabrication utilizes a wide variety of different inspection and measurement techniques (collectively called metrology) during process development and manufacturing. These techniques are used in process development to evaluate the results of processing steps, diagnose device design and fabrication problems, and help find solutions for overcoming processing issues. In manufacturing, process measurements are employed to monitor the results of processing steps and groups of processing steps, to enable the maintenance of quality control of the microsystems being produced, and thereby increase production yields and lower costs. These techniques also enable the process engineers to monitor the status of the processing equipment used in production, as well as check operator skill and handling procedures.

In the process sequences of microsystems, the fabrication engineers will identify processing steps and portions of the process sequence that require measurement information as well as the best techniques to perform these measurements. They will also identify places in the process sequence where the substrates need to be inspected to ensure that the processing results are as desired, and the methods to perform these inspections.

In general, the type and amount of measurements and inspections performed during development far exceeds that performed or needed for process control in production. As the process development mature and working devices are obtained, the fabrication engineers will scale back the number of process measurements and inspections required. The fabrication engineers always need to balance the requirements of ensuring quality control and higher yields against the substantial costs of performing measurements.

The present invention relates to metrology techniques used to inspect, measure and characterize semiconductor surfaces. The present invention relates to test structures that are used for setting up and calibrating metrology instruments used to measure and characterize features and defects made on semiconductor surfaces during or after manufacturing. Specifically, the method of manufacturing of test structures that can be used to characterize and maintain quality control of the metrology tools used in semiconductor manufacturing.

Metrology tools for semiconductor manufacturing have been a critical component of the fabrication process sequences since the earliest days of the industry. Early on it was realized that it was beneficial to inspect and measure various features on the substrates after completion of processing steps. For example, it is common practice to measure a number of points across some representative number of substrates the thicknesses of deposited thin film layers. For this purpose various tools have been developed such as optical interferometry and ellipsometry. After a photolithography processing step has been performed, it is common to inspect and/or measure the features transferred into the photoresist layer on the substrate surface. After an etching processing step has been performed, it is common to inspect and/or measure the etched features and inspect the etched features to ensure that a material layer has been completely removed in areas where it is intended to be removed by the etching. Inspections are routinely performed to ensure that the previous performed processing step(s) resulted in the desired outcome(s). Measurements are routinely performed to ensure that the dimensions fabricated are of the desired values.

State-of-the-art semiconductor technologies currently fabricate features down to less than 5 nm and these minimum feature sizes continue to decrease with each new generation of technology. At these dimensional scales, various process variations, including random and bias variations, become relatively larger (take as a percentage of the variation in the dimension and the size of the dimension) and more impactful on device behavior and performance. Additionally, the complexities of the fabrication processes, including interactions between the various processing steps and material systems, make it more challenging to detect problems and trace their origins.

Consequently, metrology tools have needed to advance and become more complex as semiconductor manufacturing has advanced. As microsystems manufacturing technologies have shrunk the feature sizes on the substrates and the manufacturing processing steps and process sequences have become more complex, the metrology tools have needed to be advanced in their capabilities, including: the ability to have a higher resolution (i.e., inspect and measure smaller feature sizes); the ability to have higher accuracy; the ability to be calibrated to traceable standards; and higher inspection and measurement rates.

One of the most important elements of metrology capabilities is to determine if the tool is inspecting and measuring properly. This is often done with pre-fabricated samples with pre-defined "test structures" or "test features" on their surfaces. These test structures are inserted into the metrology tool and examined by the tool, and the output of the metrology tool can then be compared to the expected output based on the pre-defined features.

The test structures of the present invention can be used for either optically-based inspection and measurement metrology, either narrow- or broad-band, as well as electron-beam-based metrology systems such as scanning electron microscopy (SEM). Narrowband optical radiation is electromagnetic radiation which is limited to a narrow range of frequencies whereas broadband optical radiation is over a large range of frequencies.

Optically-based metrology systems using visible light for inspection and measurements have been used for the longest time and can include the simple compound microscope. The wavelength range of visible optical radiation is about 400 nm to 700 nm. And the smallest features that can be seen using visible optical radiation is about 1 micron.

Some have defined the entire optical frequency range to be about 10 nm to 1000 microns. Obviously, this is considerably larger than the visible range. However, if combined with suitable detectors that can receive photons in all or a portion of this larger range, then it is possible to implement a metrology tool that can have a resolution down to about 10 nm for inspection and measurement of features.

As the dimensions of the features on the substrates has decreased, many of the metrology capabilities have moved from optical means of inspection and measurement, to electron-beam methods of inspection and measurement such as the scanning electron microscope (SEM).

The Scanning Electron Microscope (SEM) is a type of imaging system that uses focused electrons to image the sample rather than photons as in conventional optical microscopy. Since the wavelengths of the electrons are shorter than the wavelengths of optical photons, the maximum resolution of a SEM is superior to that of an optical microscope. Additionally, the SEM provides considerably enhanced depth of focus capability compared to an optical microscope thereby allowing the simultaneous imaging of small features having significant depth.

The electron-scanning beam is synchronized with the detector signal, in both time and position, so as to form a mapping of the intensity of the signal emitted to form an image of the surface. A SEM provides a 3-dimensional perspective of the surface with the entire image field in focus since there is not the depth of focus issues as in optical microscopy. Additionally, the sample can be tilted and rotated along multiple axes that can be used to greatly enhance the quality of the resultant image.

SEMs are capable of magnification from about 10× to 500,000× or more, and with resolutions of up to about 1 nm are possible. Nevertheless, in practice and more realistic manufacturing environments, the resolution is typically a few nanometers. The accuracy of performing dimensional measurements using a SEM is a complicated issue with a number of effects that can impact the result. Similar to many metrological technologies, the accuracy of the SEM will not be better than the resolution.

As a general rule the accuracy of a SEM for use in dimensional measurement will be improved at higher magnifications compared to lower magnifications. More exactly, the maximum resolution will only be obtained at high magnification levels.

The images formed using a SEM are prone to several types of distortions, including spatially-varying distortions and time-varying distortions. Most modern SEMs have digital image correlation software to enable these distortions to be partially corrected if used properly. However, proficient use of these software packages requires significant time commitments.

Most SEMs include the capability of a measurement scale that can be superimposed onto the image of the feature being observed. However, in order to be accurate this scale must be calibrated for the specific SEM parameters to be used in the actual measurement. There are calibration standards available for this purpose (e.g., NIST SRM 484). The calibration procedures provided by the manufacturer are typically only applicable to a specific tool. Importantly, the accuracy of these standards obviously has an impact on the resultant calibration accuracy that can be obtained. A typical uncertainty of a standard is between +/−1% to 3%.

A standard multi-purpose SEM tool allows adjustment of a number of parameters including viewing angle, accelerating voltage, and magnification level over a large range of values that may impact the accuracy of a dimensional measurement. For example, attempting to measure a feature at an off-angle requires the user to accurately know the angle of viewing (which can be difficult to know with high precision) and employ geometry to calculate the actual dimension of the feature. Consequently, when attempting to make accurate dimensional measurements, it is advisable to orient the sample to be orthogonal to the beam.

Measurement of dimensions also depends on being able to correctly identify the edges of the features. This can be difficult since the feature may have a rounded topography, rough edges, edges that are not straight, etc. The materials and material combinations imaged with the SEM also have an impact on the accuracy. Some materials and material combinations provide a sharper image than others.

Consequently, given all of the factors involved it is very difficult to provide a generic number for the accuracy of a SEM. Suffice it to say, that if everything is perfect, a measurement performed at the highest magnification, with the calibration performed correctly, and a sample oriented normally to the beam, the accuracy can be on par with the resolution of the SEM.

SEMs are invaluable in many situations and are extensively used for both development and production. As a development tool, the SEM enables inspection and measurement with a resolution that is not possible with optical microscopy. Additionally, the larger depth-of-focus capability of the SEM enables the examination of how various layers are aligned and stacked onto one another, device element positioning, etc. that is extremely valuable and cannot be obtained using any other means.

For production, the SEM can be invaluable for inspection and/or measurement of critical features. Given the feature sizes of critical dimensions of advanced integrated circuits, the SEM is the only capability for process inspection since optical microscopy does not have adequate resolution. Therefore, the automated SEM is a standard in-process inspection tools in these production environments.

The use of scanning electron microscopes for inspection and measurement of microsystem devices is an extremely valuable tool for performing forensics and diagnostics on patterned substrates during development, especially when the features to be inspected are too small for optical microscopy. However, for routine process monitoring and inspection during manufacturing, the multi-purpose SEM capability described above wherein the inspection and measurement operations are performed manually is often too time-consuming. Therefore, SEM manufacturers have responded to this need by developing automated SEMs for high-throughput inspection of patterned substrates. The systems work by imaging a known and quantified pattern on the substrate at multiple locations and using specialized software to recognize defects in these patterns and classify these defects. The analysis software in these tools can be used to map out these defects on the substrate surfaces, run statistics on these defects, and even classify the defects.

The automated SEM must be pre-programmed so as to recognize what constitutes a pattern violation. Additionally, each time a new pattern or process is to be inspected using these systems, the programming must be revised accordingly and this process is expensive in terms of both time and cost. Therefore, due to the up-front costs of these automated systems, they are most useful when the production volumes of devices is sufficiently large and using a limited number of process technologies and designs.

Commercially available automated SEM defect review and classification systems have the capability of detecting and classifying defects at the 1X nm design node. A defect is defined as a feature that is not statistically normal and results in either the device not working or not working properly.

Additionally, SEM manufacturers have also developed specialized tools called CD-SEMs that are used for the measurement of critical dimensions with high substrate throughputs. For example, these tools could be used for measuring and ensuring that the gate lengths on transistors in an advanced integrated circuit manufacturing process were fabricated according to the desired design values. The CD-SEM uses specialized software to analyze the image and determine the dimensions.

The accuracy of CD measurements depends on the calibration of the system as well as the size of the sampling areas and number of sampling points within the area, particularly when the lines being measured have line-edge roughness (LER) and line-width roughness (LWR).

These achieve a high level of precision (i.e., reproducibility in the measured values) by a number of constraints including having the beam aligned normally to the substrate and the use of a previously set of tool parameters, and a proper alignment and calibration of the tool. Most CD-SEMs specify a CD measurement repeatability of about 1% of the measurement dimension within 3G. Importantly, precision in the measurements is not the same as accuracy. If the tool is able to provide measurement precision, the accuracy can be adjusted by using a measurement standard to ensure that the measurement value coincides with the true value. Assuming all of the above procedures have been performed, then the accuracy of the CD-SEM can approach the resolution of the tool.

An important element of automated SEMs is the characterization and calibration. These are done at the factory after the tool is made and involves adjustment of the tool parameters so that it operates correctly and can measure features on advanced microsystems devices. They are also routinely performed over times as a general tool maintenance procedure. One means of performing characterization and calibration on SEM metrology tools is to use suitable test structures. The present invention teaches the manufacturing of suitable test structures that are called pin-hole test structures.

The embodiment 100 of making these pin-hole test structures is shown in FIGS. 2A-2H wherein the substrates 101 onto which these pin-hole test structures are fabricated are shown in cross section. Note that the dimensions in FIGS. 2A-2H are not to scale.

Figures 2A, 2B:
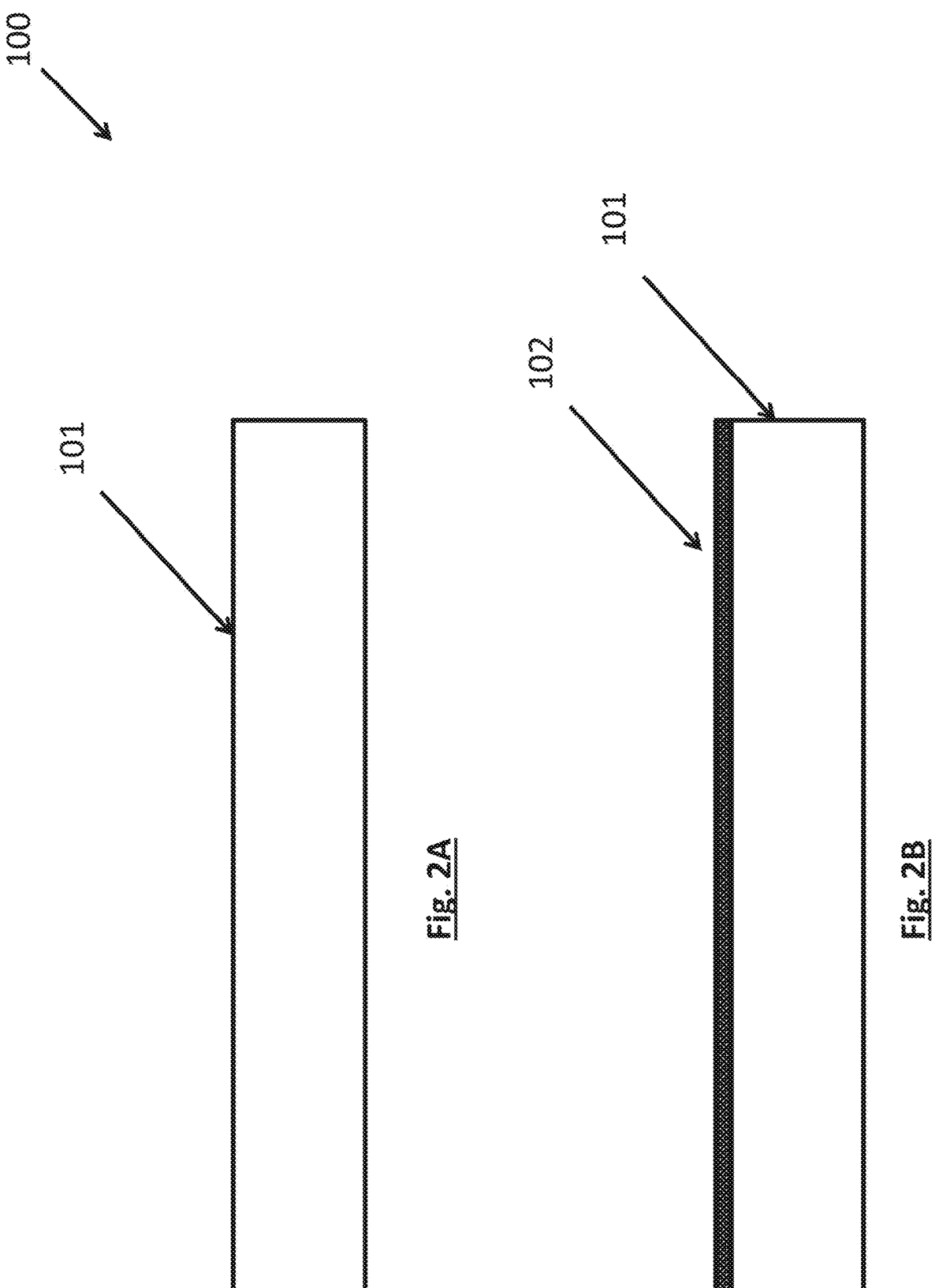
FIGS. 2A-2H illustrate a series of processing steps in the process sequence for manufacturing the test structures disclosed in the present invention.

The starting substrates 101 are single-crystal quartz or fused silica that are semiconductor grade in terms of flatness, surface roughness, and form factors (i.e., diameters and thicknesses) as shown in FIG. 2A. Nominally, 150-mm fused silica wafers are used; however, any diameter can be used depending on the number of pin-hole test structure die are desired for each process sequence run.

The first step is to ensure that the substrate surfaces 101 are sufficiently clean. That is, the removal of any chemical contaminates, residues, as well as particulates. This can be done using any of the standard substrate cleaning processes that are well known in the art including: RCA clean; piranha cleans; oxygen plasma cleans; etc. as well as combinations of these cleaning procedures.

A photoresist descum process may be performed on the substrate 101 to ensure that all organic contaminates and residues are removed. This can be done using a standard oxygen plasma exposure that is routinely called an oxygen plasma ashing and is well known in the art.

Next, as shown in FIG. 2B a thin-film layer of gold 102 is deposited using physical vapor deposition (PVD) methods onto the substrate 101, either evaporation, sputtering or similar. The thickness of the layer of gold layer 102 is 40 nanometers (nm), although other thicknesses can be used.

Subsequently, electron-beam (i.e., e-beam) lithography is performed. E-beam lithography enables very small features to be written into a suitable photoresist layer (one that is sensitive to electron beam radiation) and is capable of making features as small as a few nanometers.

Figures 2C, 2D:
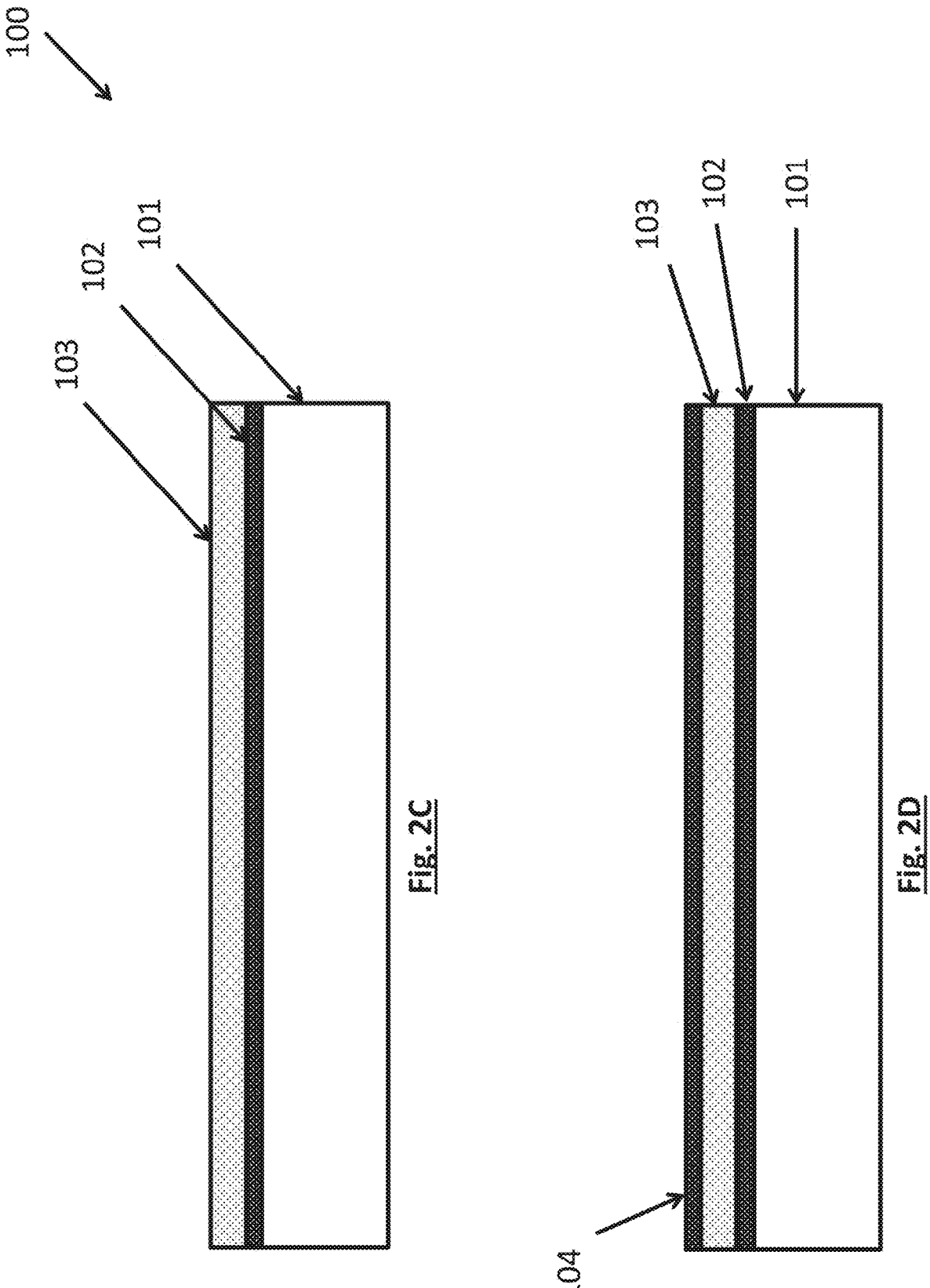

The first step in the e-beam lithography is to deposit a layer of photoresist 103 onto the top surface of the gold layer 102 that is on the substrate 101 surface (FIG. 2C). In one embodiment, the photoresist 103 is of a negative polarity type, such as NEB 31, although any suitable e-beam photoresist 103 can be used by altering the process parameters. This includes using a positive e-beam photoresist 103 except the writing pattern of the e-beam would be the inverse of that used for the negative photoresist 103. Before depositing the photoresist 103, a very thin layer (e.g., a monolayer) of HMDS (hexamethyldisilazane, also known as Bis(trimethylsilyl)amine) [not shown] is deposited onto the gold surface 102 on the substrate 101. HMDS is commonly preformed in a special tool that dehydrates the substrate 101 surfaces followed by the vapor deposition of HMDS.

The e-beam photoresist 103, NEB 31 or similar, is spun deposited onto the gold 102 surface on the substrate 101 at 4500 revolutions per minute (rpm) for 60 seconds thereby resulting in a e-beam photoresist 103 thickness of approximately 800 nm, although other thickness can be used.

A thin-film layer of gold 104 is deposited using physical vapor deposition, either evaporation or sputtering, onto the top surface of the e-beam photoresist 103 to a thickness of 40 nm (FIG. 2D). The purpose of the gold 104 is to reduce charging effects on the photoresist layer 103 when the e-beam lithography is being performed.

It is important that the e-beam photoresist 103 is exposed and developed within 24 hours after the photoresist 103 and gold 104 layers have been deposited onto the gold layer surface 102 on the substrate 101.

The e-beam exposure is then performed. The height mapping mechanism of the e-beam lithography system is enabled prior to writing.

The objective in the e-beam lithography is to define rectangular areas of photoresist 103 layer. Since the photoresist 103 is of a negative polarity type, this is achieved by having 10 nanometers by 10 nanometers squares in the design layout of the test structure patterns. These 10 nm by 10 nm squares translate into a single spot exposure of the e-beam tool. Using this e-beam spot size, features are written into the photoresist 103 that are 2000 nm by 500 nm. The recommended dosing level is 80 uC/cm$^2$ at 100 kV.

The e-beam lithography tool used in the present embodiment is a Vistec EBPG5000+HR model system, although any e-beam lithography tool with a sufficiently small spot size is sufficient. Any suitable e-beam lithography system can be used for the fabrication.

After the e-beam lithography exposure, the photoresist is post baked at 95 C for 120 seconds.

Figure 2E:
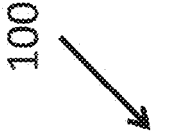
Figure 2E:
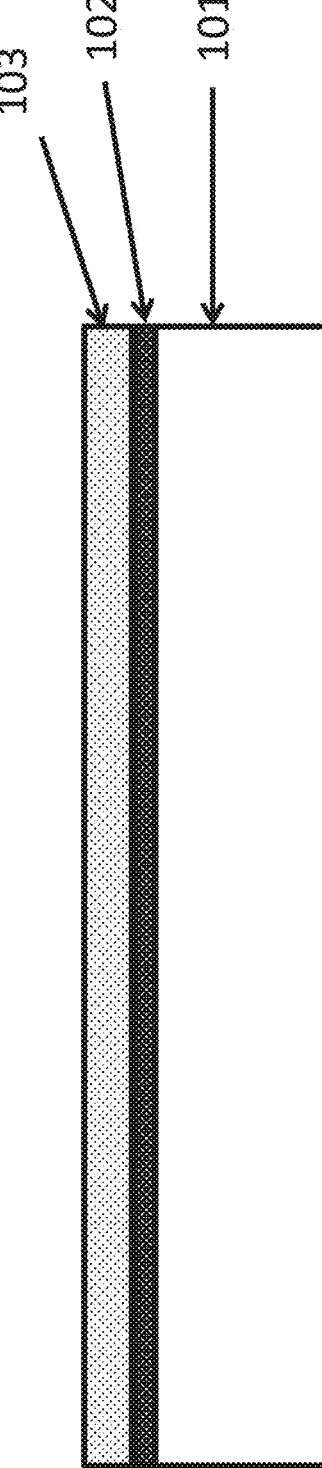
Figure 2F:
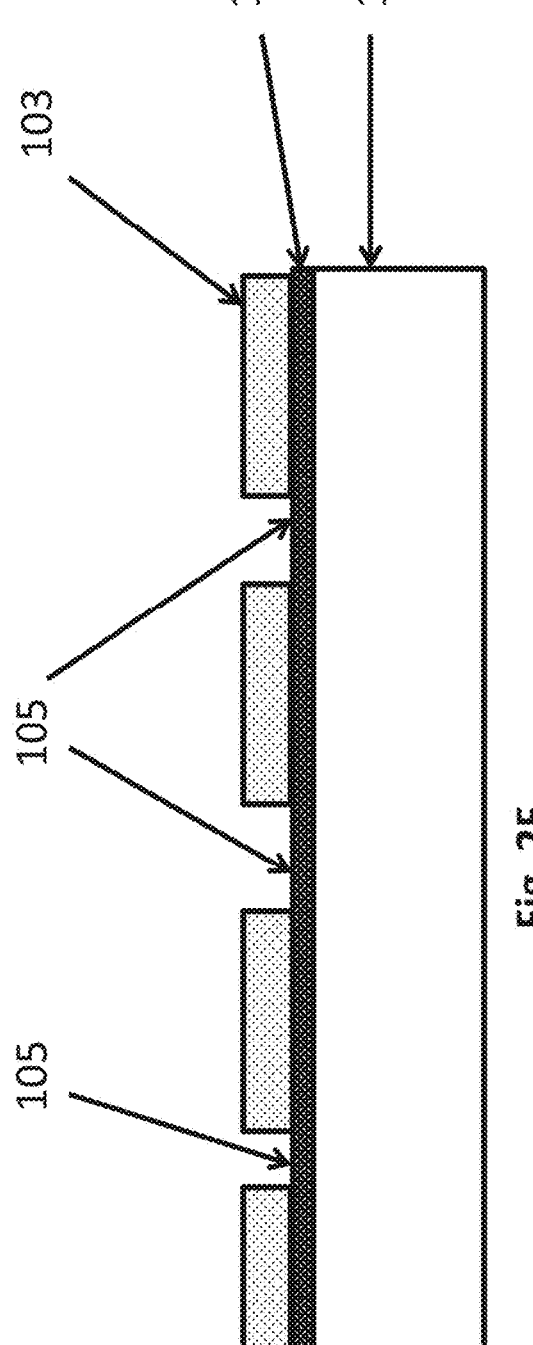

Next the top layer of gold 104 is removed (FIG. 2E). This is done prior to the development of the exposed photoresist 103. A wet immersion into a suitable gold etchant solution such as Transene gold etch, or similar can be used to removed the top layer of gold 104. The gold removal takes approximately 20 seconds.

Next, the exposed photoresist 103 is developed using the appropriate developer solution for the photoresist 103 (FIG.

2F). The developer used in the present embodiment is MF-321 or similar. The development is performed on a track system with a development time of 30 seconds, followed by a dispense at 25 rpm, followed by an agitation at 10 rpm, followed by a deionized (DI) water rinse for 60 seconds. The development of the exposed photoresist 103 results in open areas in the photoresist 103 where the underlying gold 102 layer is now exposed on the top surface of the gold 102 layer on the substrate 101.

A photoresist descum process is then performed using an oxygen plasma ashing at 400 Watts, an O2 gas flow rate of 680 standard cubic centimeters per minute, for 600 seconds. A metroline/IPC Plasma Photoresist Stripper or similar is used. This removes any residue from the photoresist left in the open areas 105 on the gold layer 102 on the substrate 101.

Figures 2G, 2H:

A thin-film layer of chromium 106 is then deposited using physical vapor deposition (PVD) methods, either evaporation or sputtering, with a thickness of 100 nm (FIG. 2G).

A photoresist wet strip is then performed using PRS 3000, or similar, solution to pattern the deposited chromium thin-film layer using lift-off. The substrate 101 is immersed into a solution of PRS 3000, or similar, that dissolves the photoresist 103 layer on the substrate. This cause the chromium 106 deposited on top of the photoresist to lift off or delaminate from the substrate 101 while the chromium 106 deposited directly onto the gold 102 layer on the substrate 101 surface stays attached to the substrate 101 surface thereby patterning the chromium 106 layer without the need for etching. This process is called "lift-off" and is well know in the art.

The patterned chromium 106 on the gold layer 102 on the substrate 101 surface has now been patterned as shown in FIG. 2H.

The substrates may then be diced into individual die for use on the metrology equipment.

Therefore, the end product of the fabrication of these test structures is composed of patterned features of chromium 106 that protrudes 100 nm vertically from the surface of the gold 102 layer on the substrate 101.

The design of the test structures can vary depending on the metrology equipment and the other facts, such as resolution, accuracy and precision of the metrology equipment to be characterized.

Figure 3:
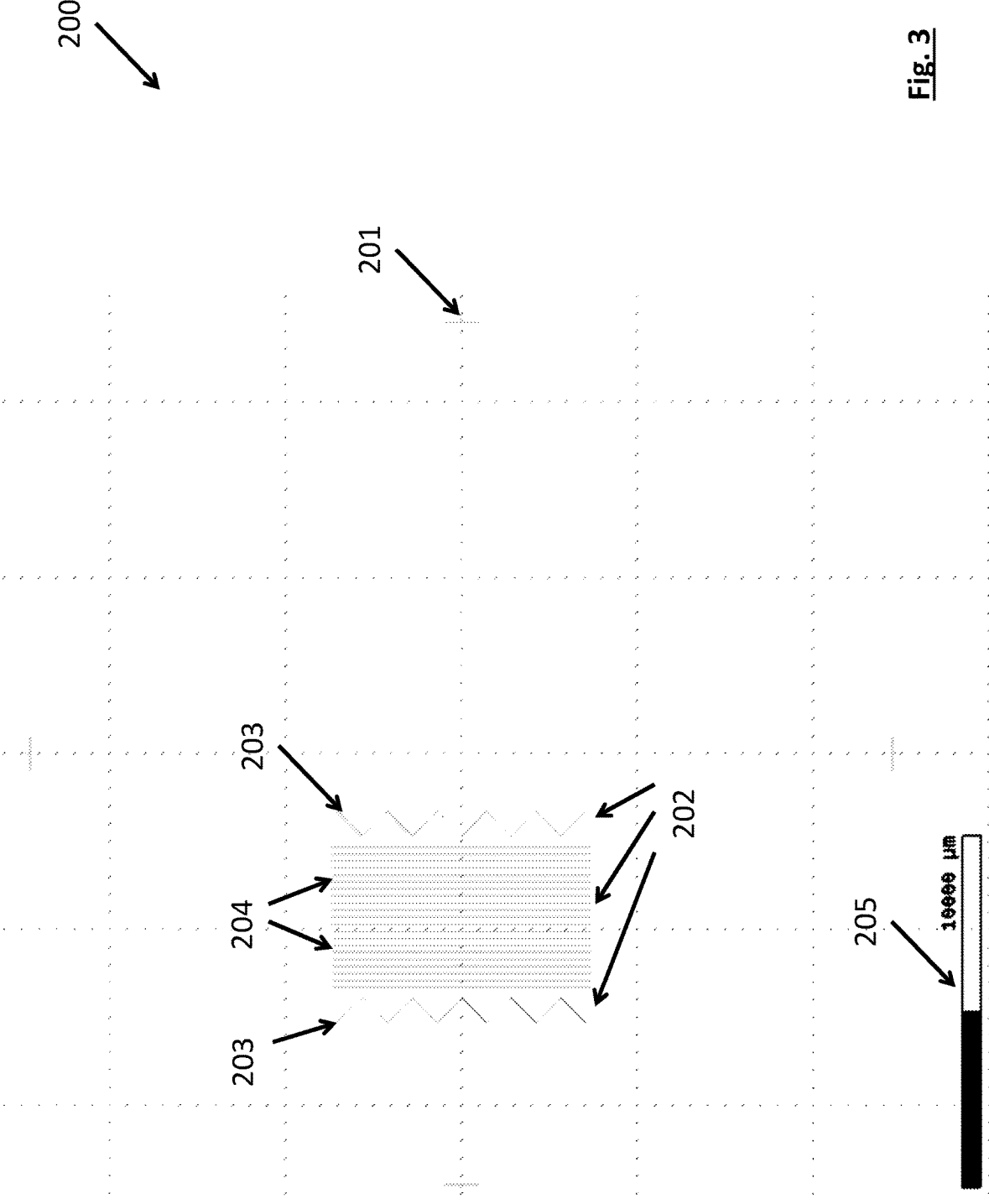
FIG. 3 is the design layout of the test structures for a single die.

The design layout of an exemplary test structure 200 that is shown in FIG. 3. The outside frame 201 of the layout 200 is clearly evident. The actual test structure 202 is composed of two lines 203 that alternate in a zig-zag manner in the vertical direction on either side of what appears to be a series of lines 204. A dimensional scale 205 is provided at the bottom left corner. As can be seen, the test structure device is composed of an array of features that are spaced over dimensions measuring several 100 of microns in both the x- and y-directions. Other dimensions may be appropriate depending on the metrology equipment being characterized and/or calibrated.

Figure 4:
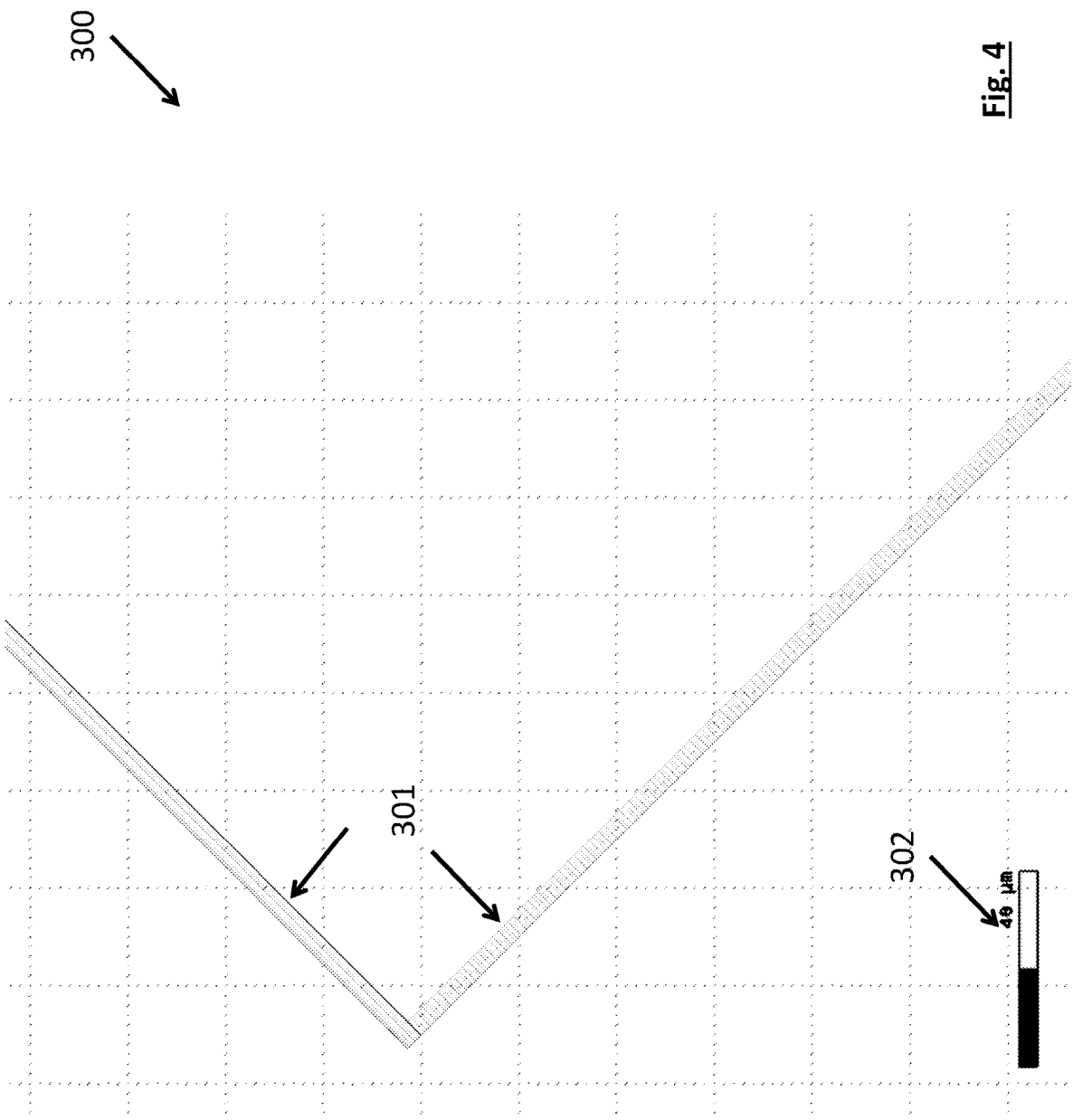
FIG. 4 is a magnified portion of the test structure pattern focusing on the zig-zag pattern.
Figure 5:
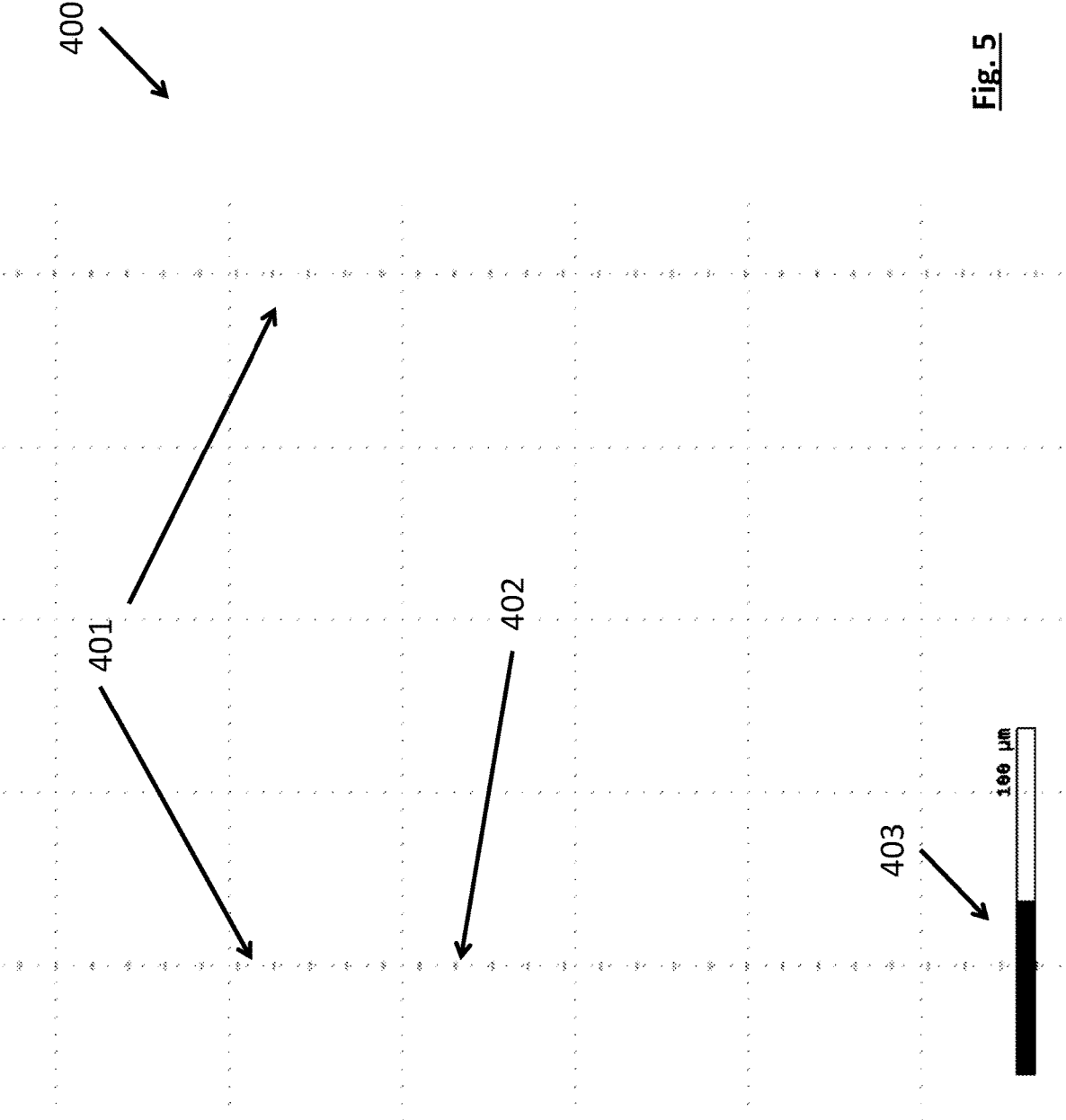
FIG. 5 is a magnified portion of the test structure pattern focusing on the array of small rectangular features.
Figure 6:
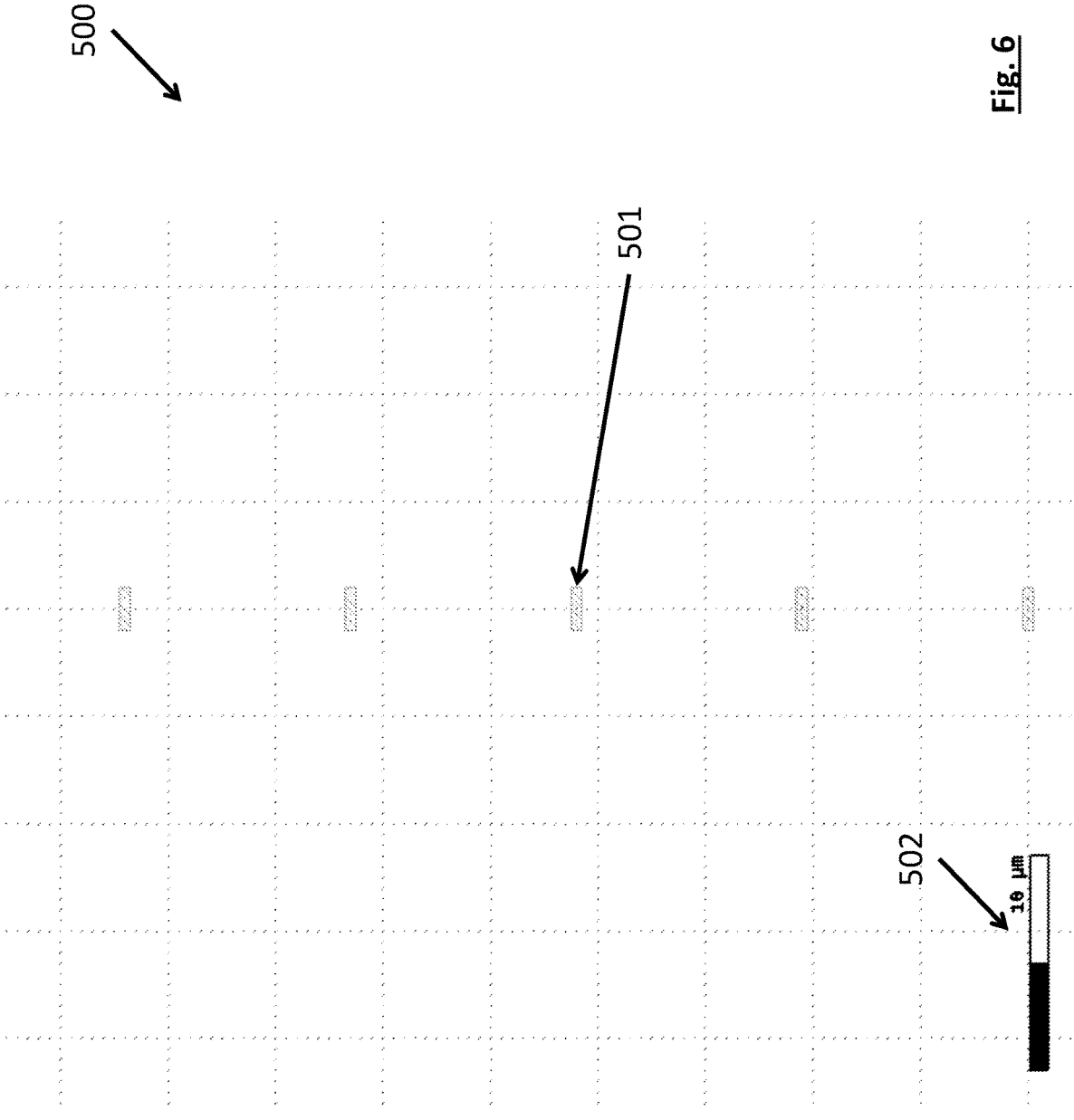
FIG. 6 is an even more magnified portion of the test structure pattern focusing on the array of rectangular features.

300 is a zoomed-in, or magnified, image of a small portion of the test structure design layout showing a part of one of the zig-zag lines 301 (FIG. 4). A dimensional scale 302 show that that layout has been magnified significantly compared to FIG. 3. As can be seen, the features are lines that zig-zag in one or both directions with a 90-degree angle between the zig and the zag elements, the width of the lines are 5 microns or less and the lengths of the line sections is 100's of microns or less. Other dimensions may be appropriate depending on the metrology equipment being characterized and/or calibrated.

400 is a zoom-in, or magnified, image of a different small portion of the test structure design layout showing two of what appeared to be vertical lines in the un-zoomed version shown in FIG. 3. It can be seen that in the zoomed-in version of the layout 400, that the two lines 401 are in composed of series of small rectangles 402 spaced in regular intervals along the vertical axis. A dimensional scale 403 is provided for reference. As can be seen, the features are arranged into an array in the x- and y-directions having dimensions of a few microns or less in both the x- and y-directions and the vertical separation between the features in the array is 10 microns or less and the horizontal separation between the features in the array is 200 microns or less. Other dimensions may be appropriate depending on the metrology equipment being characterized and/or calibrated.

500 is a more zoomed-in, or more magnified, image of a small portion of the test structure design layout showing some of the small rectangles 501 spaced in vertical intervals along the vertical axis. A dimensional scale 502 is provided for reference. It can be seen that the rectangle dimensions are 2 microns in the x-direction and 0.5 microns in the y-direction. Other dimensions may be appropriate depending on the metrology equipment being characterized and/or calibrated.

FIG. 7 illustrates a method for making test structures suitable for characterizing and calibrating semiconductor metrology equipment according to an example of the present technology. While operations in FIG. 7 are shown in a specific order, one or more of the operations may be omitted, substituted by another operations, and/or repeated.

The test structure may be fabricated by selecting a suitable first substrate (step 710), performing a cleaning process on the first substrate to remove any residues and contaminates from the surfaces of the first substrate (step 712); depositing a first layer of gold using physical vapor deposition onto a surface of the first substrate (step 714); dehydrating the first substrate (step 716); depositing a second layer of photoresist sensitive to e-beam lithography radiation by spin casting onto the first layer of gold (step 718); and depositing a third layer of gold using physical vapor deposition onto a top surface of the second layer of photoresist (720).

The method may further include performing electron-beam exposure lithography onto the second layer of photoresist to transfer a test structure (or structures) design layout to the second layer of photoresist (step 722); performing a post-exposure bake on the second layer of photoresist (step 724); removing of the third layer of gold deposited on top of the second layer of photoresist (step 726); performing development of the second layer of photoresist to pattern the second layer of photoresist (step 728); depositing a thin-film fourth layer of chromium onto the first substrate using physical vapor deposition whereby the fourth layer of chromium is deposited onto the second layer of photoresist where the second layer of photoresist remains after development and whereby the fourth layer of chromium is deposited directly onto the first layer of gold deposited onto the surface of the first substrate (step 730); and performing lift-off patterning of the fourth layer of chromium by removing the patterned second layer of photoresist thereby leaving the fourth layer of chromium only on those areas on the first layer of the gold where the second layer of photoresist was removed by development (step 732).

It is understood that the embodiments presented herein are representative of only some of the possible types, dimensions and spacing of features suitable for characterizing and calibrating metrology equipment for the semiconductor manufacturing industry.

What is claimed:

1. A method for making one or more test structures suitable for characterizing and calibrating semiconductor metrology equipment, wherein the one or more test structures are fabricated by:

selecting a suitable first substrate;

performing a cleaning process on the first substrate to remove residues and contaminates from the surfaces of the first substrate;

depositing a first layer of gold using physical vapor deposition onto a surface of the first substrate;

dehydrating the first substrate;

after dehydrating the first substrate, vapor depositing a monolayer of hexamethyldisilazane (HMDS) onto the first layer of gold;

after deposing the monolayer of HMDS, depositing a second layer of photoresist sensitive to e-beam lithography radiation by spin casting onto the monolayer of HMDS on the first layer of gold;

depositing a third layer of gold using physical vapor deposition onto a top surface of the second layer of photoresist;

performing electron-beam exposure lithography onto the second layer of photoresist to transfer a test structure design layout to the second layer of photoresist;

performing a post-exposure bake on the second layer of photoresist;

removing the third layer of gold deposited on top of the second layer of photoresist;

performing development of the second layer of photoresist to pattern the second layer of photoresist;

depositing a thin-film fourth layer of chromium onto the first substrate using physical vapor deposition whereby the fourth layer of chromium is deposited onto the second layer of photoresist where the second layer of photoresist remains after development and whereby the fourth layer of chromium is deposited directly onto the first layer of gold deposited onto the surface of the first substrate;

performing lift-off patterning of the fourth layer of chromium by removing the patterned second layer of photoresist thereby leaving the fourth layer of chromium only on those areas on the first layer of the gold where the second layer of photoresist was removed by development to provide a plurality of patterned chromium features; and dicing the first substrate into plurality of die, each die of the plurality of die including patterned chromium features that protrude vertically from the first layer of the gold.

2. The method of claim 1, wherein the first substrate is made of fused silica.

3. The method of claim 1, wherein the first layer of gold has a thickness of 40 nanometers.

4. The method of claim 1, wherein the second layer of photoresist is of a negative polarity type.

5. The method of claim 1, wherein the third layer of gold has a thickness of 40 nanometers.

6. The method of claim 1, wherein the fourth layer of chromium has a thickness of 100 nanometers.

7. The method of claim 1, where the second layer of photoresist has a thickness of more than 100 nanometers.

8. The method of claim 1, wherein the patterned chromium features include zigzag lines and a plurality of rectangles spaced in regular intervals.

9. The method of claim 1, wherein the patterned chromium features include lines that zig-zag in one or both directions with a 90-degree angle between zig elements and zag elements of the zig-zag.

* * * * *